United States Patent [19]

Schoen

[11] 4,307,345
[45] Dec. 22, 1981

[54] CIRCUIT RECLOSER TEST SET
[75] Inventor: Paul E. Schoen, Cockeysville, Md.
[73] Assignee: E.I.L. Instruments, Inc., Sparks, Md.
[21] Appl. No.: 103,468
[22] Filed: Dec. 14, 1979

Related U.S. Application Data
[63] Continuation-in-part of Ser. No. 88,533, Nov. 26, 1979.
[51] Int. Cl.³ .................................. G01R 31/02
[52] U.S. Cl. .................... 324/424; 324/73 R
[58] Field of Search .......... 324/73 AT, 418, 423, 324/424

[56] References Cited
U.S. PATENT DOCUMENTS
2,806,186  9/1957  Brown ........................ 324/418
3,609,523  9/1971  Knox ......................... 324/424
4,055,801 10/1977  Pike ......................... 324/73 AT
4,105,965  8/1978  Russell ...................... 324/424

Primary Examiner—Michael J. Tokar
Attorney, Agent, or Firm—Witherspoon & Hargest

[57] ABSTRACT

A test set designed to energize an oil filled circuit recloser with a reasonably constant current to simulate fault conditions for the purpose of verifying the recloser operation as specified by manufacturer's performance curves is disclosed. The test set of this invention is a self-contained unit comprising a selectable tapped auto-transformer, a variable vernier auto-transformer, a selectable power resistance bank, an output transformer, a control package and a monitor package.

14 Claims, 7 Drawing Figures

CIRCUIT RECLOSER TEST SET

This application is a continuation-in-part of my application Ser. No. 88,533 filed Nov. 26, 1979 entitled "Ammeter for Measuring High Current" and the benefit thereof is claimed pursuant to 35 USC section 120.

BACKGROUND OF THE INVENTION

This invention relates to test equipment, and more particularly to test equipment designed to test circuit reclosers.

If a fault occurs in a power line protected by a circuit recloser, the circuit recloser senses the fault and removes power from that line. After a given period of time, the circuit recloser closes and restores power. If the fault condition is still present, the recloser again opens to remove power from the line. If the fault is no longer present when the recloser closes, it remains closed to maintain power on the line. If the fault persists, the recloser opens and closes a given number of times and then latches open. When latched open it must be mechanically reset.

The operational characteristics of a circuit recloser are generally specified by performance curves provided by the manufacture of the circuit recloser. The recloser test set of this invention simulates fault conditions and provides the data necessary for verifying the operation of a circuit recloser as specified by the manufacturer's performance curves.

Examples of prior circuit breaker test sets and relay test devices are disclosed in the following U.S. Patents; U.S. Pat. No. 3,328,638 to Reis; U.S. Pat. No. 3,532,967 to Milton et al, U.S. Pat. No. 3,678,372 to Elder; U.S. Pat. No. 3,924,178 to Lockyer et al; U.S. Pat. No. 4,105,965 to Russell and U.S. Pat. No. 4,128,804 to Russell. The test set of this invention is specifically designed to test circuit reclosers and represents an improvement over prior art circuit recloser test sets.

SUMMARY OF THE INVENTION

This invention provides a test set for testing an oil-filled circuit recloser. The test set of this invention is a self-contained unit comprising: a selectable-tapped auto-transformer for input voltage ranging and course output control; a continuously variable vernier auto-transformer for fine output control; a selectable power resistance bank for compensation for load impedance changes; an output transformer having a plurality of taps, isolated from the input line; a control package which initiates the test sequence and stops or inhibits operation upon activation of safety interlocks or operation of a stop command; and a monitor package which records the time of trip and reclosure, stores the current value of each slot for subsequent recall, aborts testing in the event of excess shots or excess time, and shuts off test voltage after determination of lock-out.

In operation, the test set of this invention sequences the recloser under test through the number of shots (openings and closing and then lock-out) for which that recloser is designed. The test set records the time interval of each trip and reclosure, stores the current value of each shot for subsequent recall, aborts testing in the event of excess shots or excess time and shuts off the test voltage after determination of lock-out.

BRIEF DESCRIPTION OF THE DRAWING

A full and complete understanding of the invention can be obtained from the following detailed description of the invention when read with the annexed drawing in which.

DETAILED DESCRIPTION OF THE INVENTION

Figure 1:
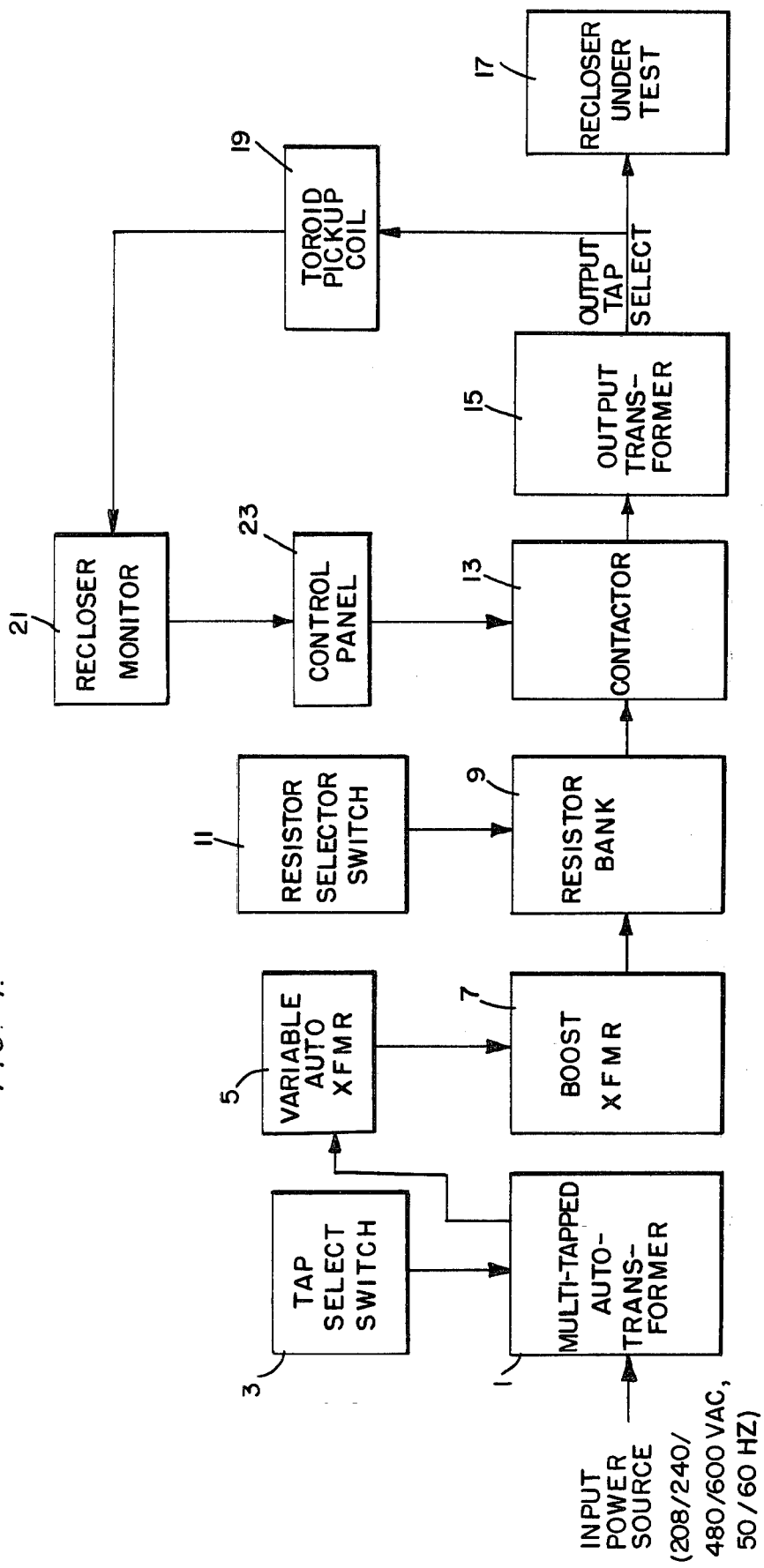
FIG. 1 is an overall block diagram showing a preferred embodiment of the test set of this invention.

Referring to FIG. 1, the circuit recloser test set of this invention comprises a multi-tapped auto-transformer 1 coupled to one of several AC sources. Multi-tapped transformer 1 provides input voltage ranging and coarse output control. A tap selector switch 3 for selecting the desired tap of multi-tapped auto-transformer 1 is coupled to multi-tapped auto-transformer 1. The taps in auto-transformer 1 are such that an output voltage of from 0 to 560 volts can be selected by means of tap select switch 3 in steps of 70 volts.

The output of auto-transformer 1 is coupled to the variable auto-transformer 5. Variable auto-transformer 5 feeds the boost transformer 7. Variable auto-transformer 5 is continuously variable and provides a continuous adjustment of 0 to 80 volts through boost transformer 7. This permits the precise setting of output currents between the values determined by the tap selection on auto-transformer 1.

Boost transformer 7 is coupled to resistor bank 9. Resistor bank 9 is a bank of resistor elements that are selectively placed in the circuit by means of the resistor select switch 11. That is the number of resistor elements and therefor the value of the resistance placed in the circuit by resistor bank 9 is selectable by means of resistor selector switch 11. The output of resistor bank 9 is coupled to the primary of the output transformer 15 through a heavy duty contactor 13. The secondary of output transformer 15 has a plurality of taps to provide a range of output voltages and currents to facilitate testing of a wide range of circuit recloser ratings. The circuit recloser 17 under test is connected to the appropriate tap on the secondary of output transformer 15. The resistance in the primary circuit is selected such that the variable impedance of an operating recloser, as reflected through the output transformer, is effectively swamped out. This causes the output current to be regulated sufficiently to ensure proper recloser operation.

The elements just described make up the primary or power circuit of the test set of this invention. The various circuit elements of this primary circuit are shown in block diagram form since these elements are well known circuit elements.

A split (or donut) air-core toroid 19, placed around the conductor feeding current to recloser 17, senses the current being applied to recloser 17. Toroid 19 is coupled to recloser monitor 21. The control panel 23 is coupled to both recloser monitor 21 and to the primary or power circuit.

Figure 2:
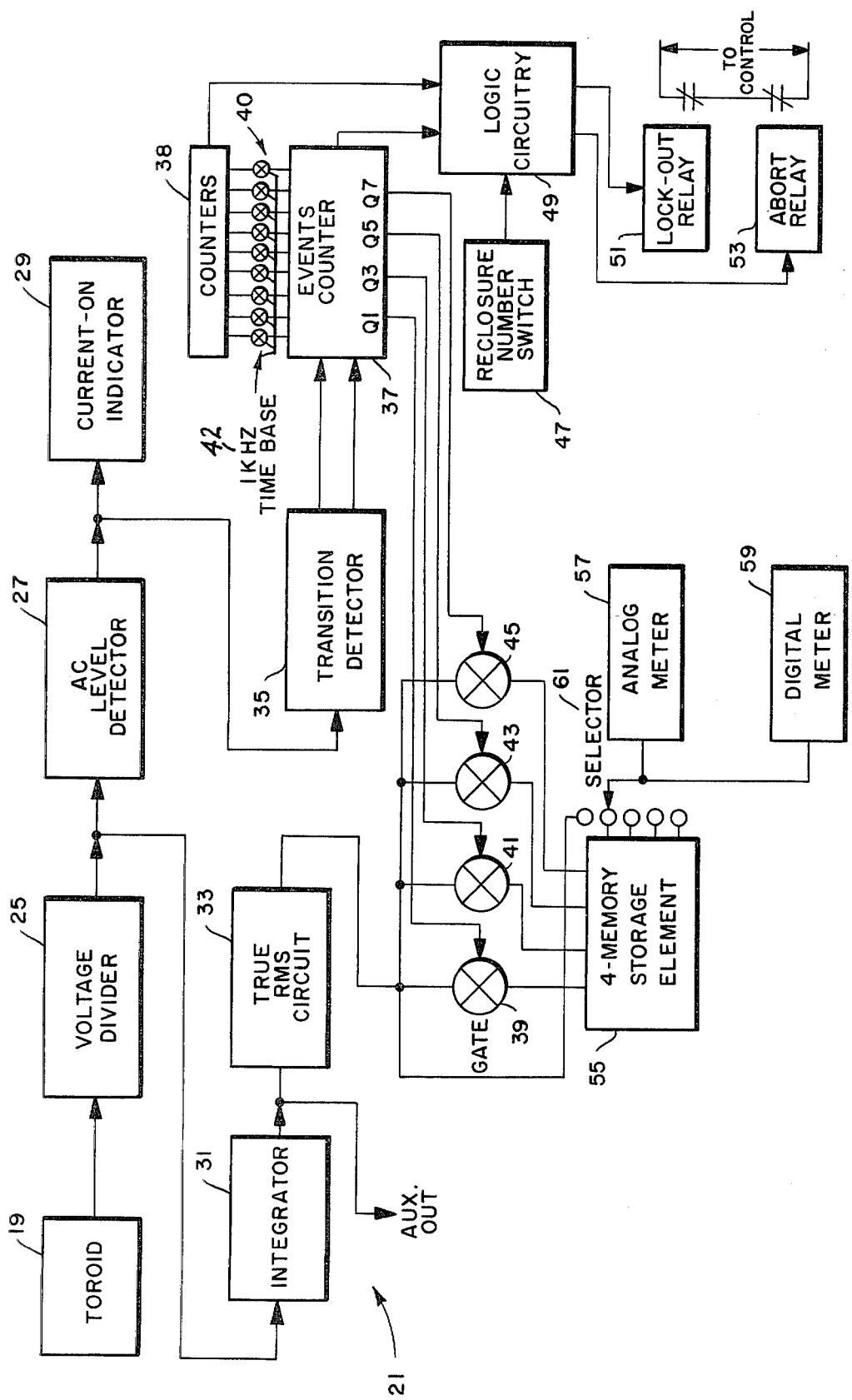
FIG. 2 is a block diagram showing a preferred embodiment of the monitor of this invention.

FIG. 2 is a block diagram showing the various elements of recloser monitor 21 of FIG. 1. As shown in FIG. 2, recloser monitor comprises a voltage divider 25 coupled to toroid 19. The output of voltage divider 25 is coupled to the input of the AC level detector 27 and to the input of the integrator 31. The output of AC level detector 27 is coupled to the current-on indicator 29 and to the input of the transition detector 35. The output of transition detector 35 is coupled to the events counter 37. Events counter 37 sequentially couples a 1 KHZ time base 42 to counters 38 by means of a plurality of gates 40. Events counter 37 is also coupled to the logic circuit 49 and to the gates 39, 41, 43 and 45. Logic circuit 49 is coupled to lock out relay 51, to the abort relay 53 and to counters 38. The reclose number switch 47 is also coupled to logic circuit 49.

The output of integrator 31 is coupled to the input of the true RMS circuit 33 and the output of true RMS circuit 33 is coupled to a second input of each of the gates 39, 41, 43 and 45. The output of each of the gates 39, 41, 43 and 45 is coupled to separate inputs of the 4-memory storage element 55. The output of 4-memory storage element 55 is coupled to the analog meter 57 and to the digital meter 59 through the shot selector switch 61.

Figure 3:
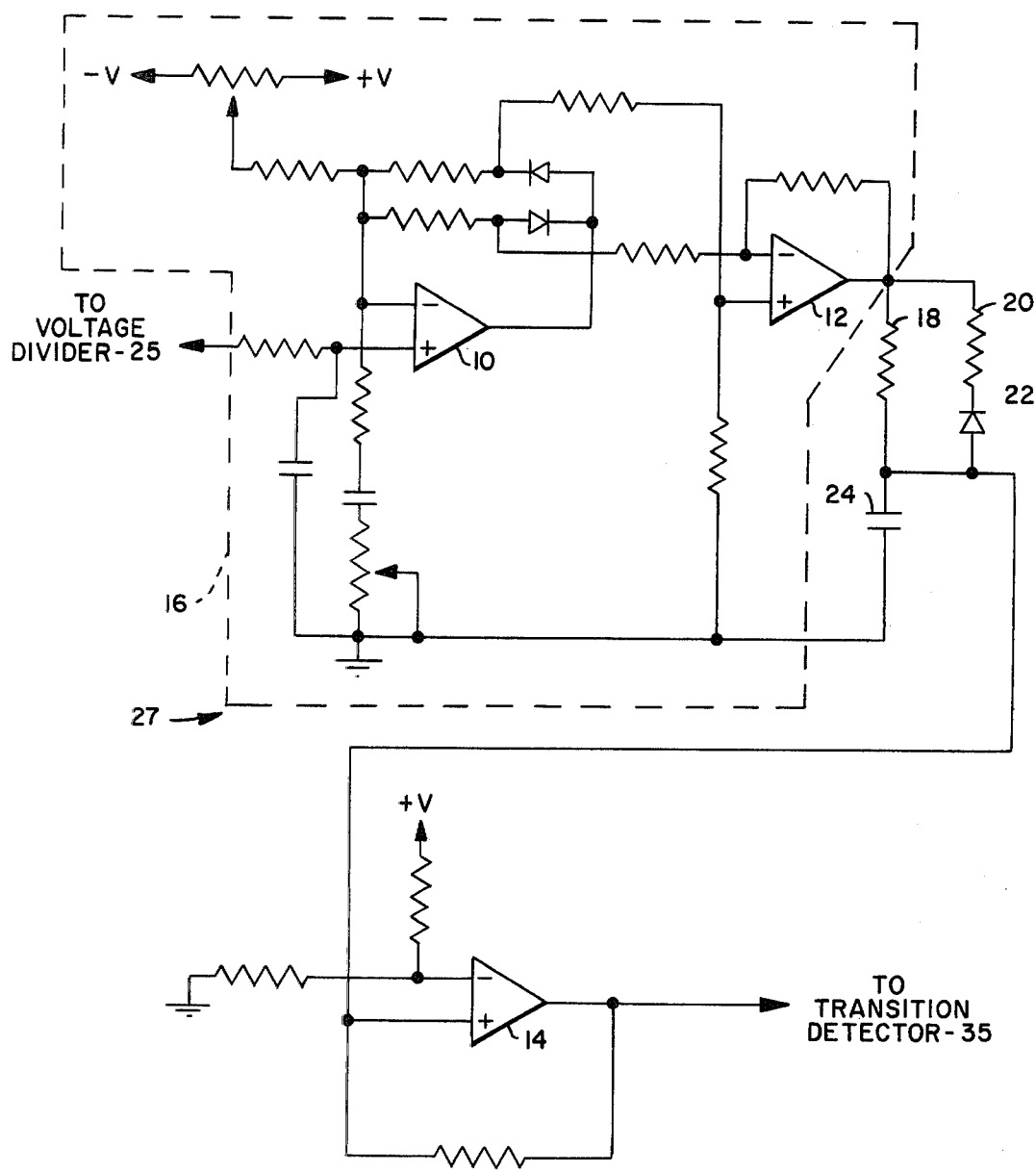
FIG. 3 is a schematic diagram of the AC level detector of the monitor of FIG. 2.
Figure 4:
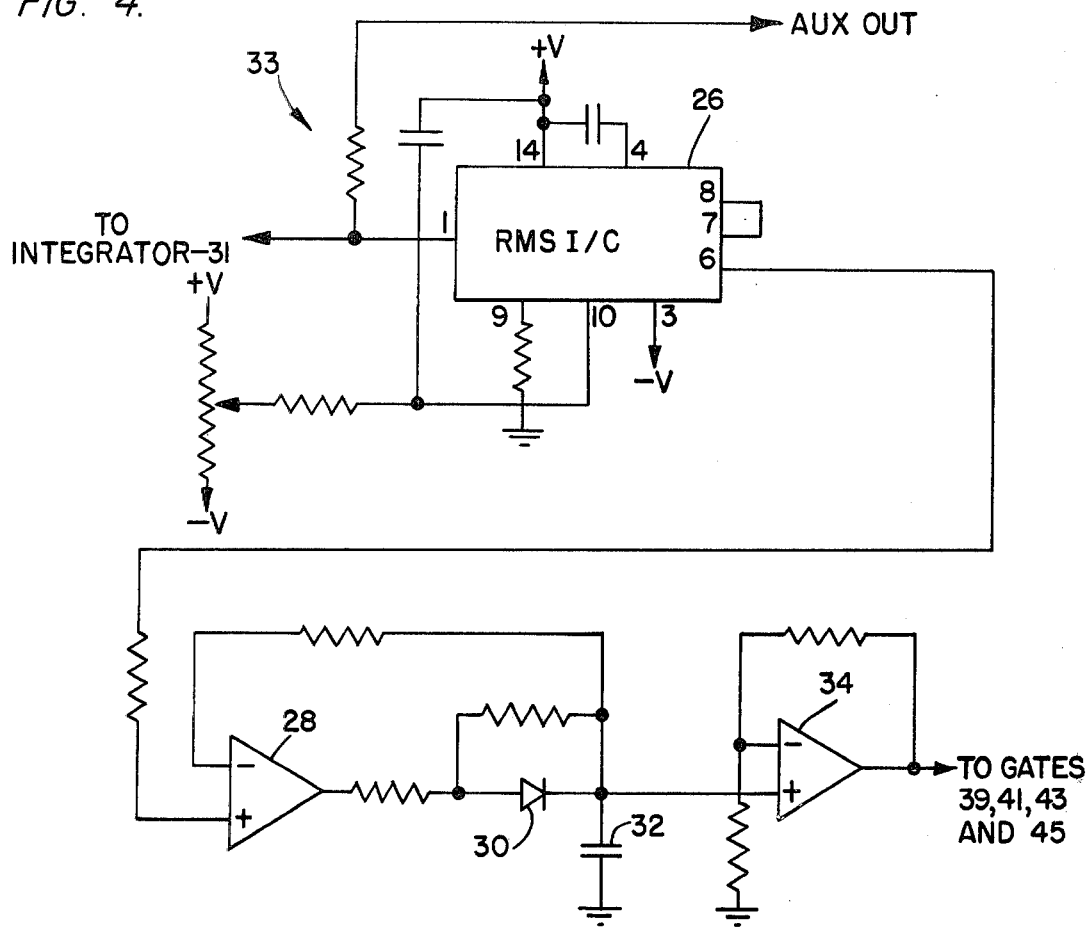
FIG. 4 is a schematic diagram of the true RMS circuit of the monitor of FIG. 2.

Recloser monitor 21 is basically a modification of the ammeter for measuring high current disclosed in my copending application Ser. No. 88,533 filed Oct. 26, 1979. Further, except for true RMS circuit 33 and AC level detector 27, the remaining circuit elements of recloser monitor 21 are conventional elements and are therefore shown in block diagram form. FIG. 3 is a schematic diagram of a preferred embodiment of AC level detector 27 and FIG. 4 is a schematic diagram of a preferred embodiment of true RMS circuit 33. These circuits are shown and described in detail in my said copending application Ser. No. 88,533.

However, in order to provide a complete description of recloser monitor 21 and true RMS circuit 33 and AC level detector 27 in this application, a description of the operation and circuit details of AC level detector 29 and true RMS circuit is provided herein.

As shown in FIG. 3, AC level detector 27 includes a precision rectifier which is made up of the circuit element enclosed in the dotted box labelled 16 in FIG. 3. More specifically, the precision rectifier includes the operational amplifiers 10 and 12. The DC on the output circuit of operational amplifier 12 is applied to a filter made up of the resistors 18 and 20, the diode 22 and the capacitor 24. This is a slow-attack fast decay filter. The output of this filter is applied to the + input of the operational amplifier 14. The voltage divider formed by the resistors 18 and 20 establishes the level at which operational amplifier 14 produces an output. When the AC signal from voltage divider 25 is in excess of 10% of full scale, AC level detector 27 generates an output signal throughout the duration of the pulse sensed by toroid 19. This signal which is present on the output of operational amplifier 14 is applied to transition detector 35 and to current-on indicator 29. The output of transition detector 35 is applied to events counter 37.

As will be apparent later, recloser 17 is progressed through the number of shots (openings and reclosing) for which the recloser is designed. Each time the recloser is tripped transition detector 35 provides an event signal to events counter 37 and each time the recloser under test closes or opens, transition detector 35 provides an output to events counter 37. The time that current is applied to the recloser under test before it trips is established by counters 38 and the time interval between each opening and reclosing is also established by counters 38 coupled to 1 KHZ time base 42 and events counter 37. Events counter 37 is also coupled to the logic circuit 49. The switch 47 establishes the number of shots for the recloser under test. This switch is of course set to the number of shots anticipated for a given recloser as specified by the manufacturer. Logic circuit 49 is also coupled to lock-out relay 51 and abort relay 53.

Events counter 37 is also coupled through separate outputs to one input of each of the gates 39, 41, 43 and 45. A gating signal is applied to gate 39 from events counter 37 during the time current is applied to the recloser under test for the first shot, to gate 41 during the time current is applied for the second shot and so on for the third and fourth shot to 43 and 45 respectively, if third and fourth shots are taken.

The output of voltage divider 25 is also coupled to integrator 31 which in turn is coupled to true RMS circuit 33. The circuit details of true RMS circuit 33 are shown in FIG. 4. As shown in FIG. 4, the output of integrator 31 is applied to pin 1 of the RMS integrated circuit chip 26. RMS integrated circuit chip 26 is an integrated circuit chip that is available on the market. The output from RMS integrated circuit chip 26 is taken from pin 6 and applied to the + input of operational amplifier 28. The output of operational amplifier 28 charges the capacitor 32 through the diode 30. Diode 30 blocks negative voltage. Capacitor 32 is charged very rapidly and then discharges slowly. Thus, diode 30, capacitor 32 and the associated resistors form a fast attack-slow decay filter. This filter minimizes the effect of ripple without sacrificing fast pulse response time. The output from this fast attack-slow decay filter is applied to the + input of the operational amplifier 34 and the output of operational amplifier 34 is applied to the second input of each of the gates 39, 41, 43 and 45.

Assuming that the test set of this invention is operating on the first shot, the output of true RMS circuit 33 is applied to 4-memory storage element 55 through gate 39 which has been opened by the voltage from events counter 37, present on its other input. Memory storage element 55 may comprise four storage capacitors. The taps of selector 61 are each coupled to a different one of the storage capacitors of memory storage element 55 and a fifth tap is coupled directly to the output of true RMS circuit 33. When selector switch 61 is positioned on the tap corresponding to the first shot, analog meter and digital meter 59 give a reading of the current present during the first shot. For each additional shot, the monitor 21 operates in a similar manner with gate 41 being open on the second shot to pass the output of true RMS converter 33 to the second of the four capacitors in storage element 55, gate 43 open on the third shot and gate 45 open on the fourth shot.

Figure 5:
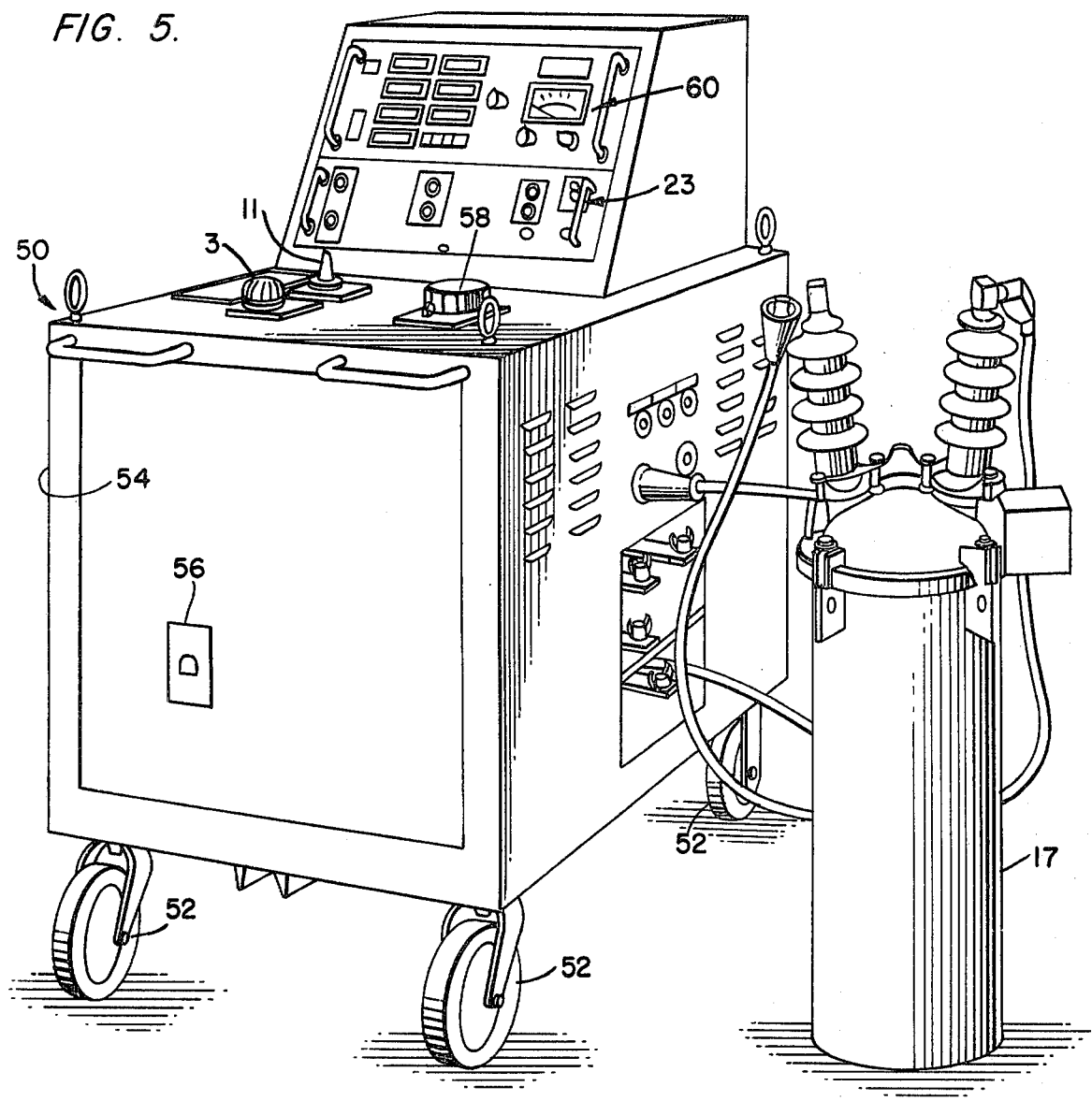
FIG. 5 is a plan view showing the preferred overall construction of the test set of this invention.

Referring to FIG. 5, this figure shows the preferred structural configuration of the test set of this invention. As shown in FIG. 5, the test set is housed in a cabinet 50 that is mounted on the wheels 52 so that it can easily be moved from place to place. Four wheels, only three of which are visible in FIG. 5, are of course provided. The primary or power circuit is housed inside the body 54 of cabinet 50. The switch 56 is the on-off power switch.

Tap select switch 3 and resistor select switch 11 are located on the top left side of body 54. The knob 58 located on the top right of body 54 is used to adjust variable auto-transformer 5. Control panel 23 is located as shown in FIG. 5. The panel 60 mounted above control panel 23 is the panel of recloser monitor 21.

Figure 6:
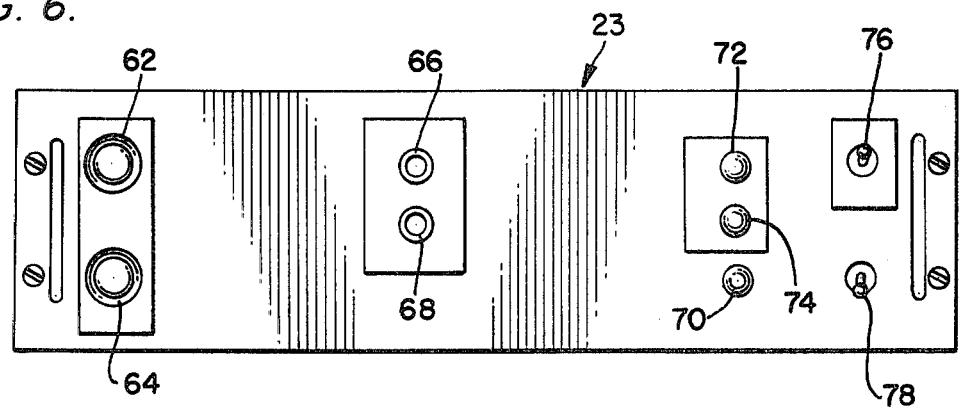
FIG. 6 is a plan view showing the details of the control panel of this invention.

Referring to FIG. 6, which shows the face of control panel 23, the push button switch 62 is the initiate switch and is depressed to initiate a test sequence. If the test set is ready to begin a test, switch 62 latches on and remains on until stopped automatically or manually by depressing the stop switch 64. The indicators 66 and 68 are test voltage indicators. When contactor 13 is closed and the test voltage is applied to the recloser under test indicator lamp 66 is energized. When contactor 13 is open the lamp of indicator 68 is energized.

Resistor bank 9 is provided with a thermal sensor and cut-out. If the temperature of resistor bank becomes too high, the cut-out will stop all testing until the temperature has reached a safe level. When a thermal cut-out takes place, the thermal cut-out indicator lamp 70, is energized. The indicators 72 and 74 are interlock indicators. Upper indicator 72 is energized when either a selector switch 3 is depressed to change the tap on auto-transformer 3 or resistor select switch 11 is depressed to change the resistor combination. These switches are first depressed and then rotated. Lower indicator 74 is energized if either or both the front and back doors of cabinet 50 are open. The switch 76 is an auto/manual control switch. This switch permits an operator to utilize the automatic shutoff features of the test set in one position of the switch or to bypass the monitor in its other position. The indicator 78 is the power on indicator and the lamp of this indicator is energized when the power within the test set is on.

Figure 7:
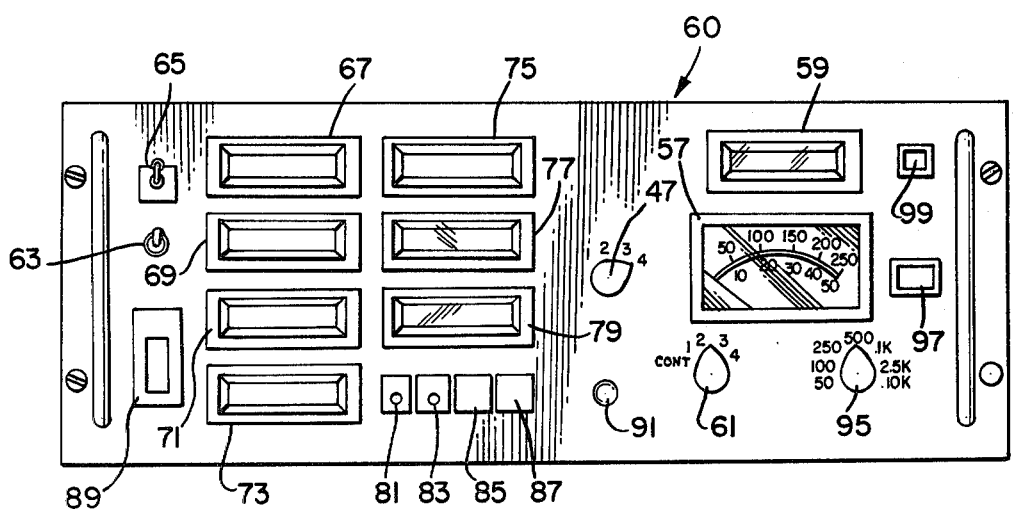
FIG. 7 is a plan view showing the details of the monitor panel of this invention.

The details of panel 60 of recloser monitor 21 are shown in FIG. 7. As shown in FIG. 7 panel 60 contains a power on switch 89, a time limit switch 63 used to select a time limit of 10 or 20 seconds for each operation of the circuit recloser under test, and a ready lamp 65. Panel 60 also includes the four digital trip time meters 67, 69, 71 and 73 and the other three digital reclosure time meters 75, 77 and 79. Panel 60 further includes the normal lamp indicator 81 which is energized at all times when proper or normal conditions exist; the lockout indicator lamp 83 which is energized after the last expected shot; the excess shot indicator lamp 85 which is energized if an extra unexpected shot takes place; the abort lamp indicator 87 which is energized when a test is aborted for some reason; an auxiliary output jack 91 which is coupled to the output of true RMS circuit 33; shot select switch 61; analog meter 57; a meter range switch 95 for selecting the range of analog meter 57; a reset button 97 for resetting the meters to zero; the current on indicator lamp 99; and digital current meter 59.

Circuit reclosers such as circuit recloser 17 are designed to trip (open) when a fault occurs in the line being protected by the recloser. After a given period of time, the circuit recloser automatically closes to check whether or not the fault condition still exists. If the fault has cleared, the recloser remains closed. If the fault is still present the recloser trips again. This process is repeated several times until the recloser latches out and has to be reset manually after the fault is cleared. Many reclosers are designed to go through four slots before latching out. That is the recloser trips and resets three times and then on the fourth trip latches out. Other reclosers go through only two shots, latching out on the second trip. In any event the number of shots for a given recloser is dictated by the design of the recloser and is designated by the manufacturer.

In the following description of the operation of the test set, it is assumed that recloser 17 is connected to the proper tap on the secondary of output transformer 15; and that tap select switch 3, variable auto-transformer 5 and resistor select switch 11 have all been properly set so that the proper value of current will be applied to recloser 17. It is further assumed that recloser 17 is expected to cycle through four shots. With these assumptions and with all power switches on, a test is conducted as follows: auto/manual control switch 27 is switched to the automatic position; reclose number switch 47 is set to the number of shots expected to lockout (in this case 4); shot select switch 61 is set to the continuous position; range select switch 95 is set to the proper meter range; and time limit switch 52 is set to ten seconds. When slot select switch 61 is in the continuous position it is connected to the fifth tap which is directly connected to true RMS circuit 33 and analog meter 57 and digital meter 59 continuously read the output current from true RMS circuit 33. Time limit switch 53 has two positions a 10 second position and a 20 second position. This switch establishes the time limit as counted by counters 38. In the 10 second position, an output signal is applied to logic circuit 49 from counters 38 if recloser 16 hangs up more than 10 seconds after the fault current is applied or fails to reclose in 10 seconds.

Before proceeding further with the test, all meters are checked to make sure they have been reset. If not reset, reset button 97 is depressed until all meters are reset. Initiate switch 62 is now depressed and circuit recloser 17 should now cycle through four shots to lockout. That is recloser 17 should trip three times, reclose three times and then latch out after a fourth time. Assuming the test ran correctly, the time interval between the time current was applied and recloser 17 tripped is displayed on a digital meter 67 for the first trip, on digital meter 69 for the second trip, on digital meter 71 for the third trip and on digital meter 73 for the fourth trip. Similarly, the time interval between trip and reclosing of recloser 17 is displayed on digital meter 75 for the first reclosure, on digital meter 77 for the second reclosure, and on digital meter 79 for the third reclosure. These meters are all read and their readings are recorded by the operator. Shot select switch 61 is now switched from the continuous position to the first position. In this position analog meter 57 and/or digital meter 59 both read the current present during the first trip. This current value is recorded. Shot select switch 61 is then turned to position 2, then to position 3 and then to position 4 to obtain the value of current present during the second, third and fourth trips respectively. These values are also recorded by the operator. The positions of tap select switch 3, variable auto-transformer 5 and resistor select switch 11 are also recorded. With this information, the operator can check the recloser under test with the manufacturer's performance curves to determine whether or not the recloser functioned in accordance with the manufacturer's specifications.

At the end of the cycle, fourth trip and then latch out of recloser 17, the test system remains on for a short period of time 3–5 seconds to check for an improper excess shot; in this case a fifth shot. If no additional shot occurs, a lock out signal is applied to relay 57 and power is removed from the primary or power circuit. If an excess shot takes place power is removed from the primary or power circuit by abort relay 53 and the lamp of excess shot indicator 85 is energized. Similarly, if recloser 17 hangs up for more than ten seconds or does not reclose in 10 seconds, and if some other malfunction occurs, abort relay 53 removes power from the primary or power circuit of the test set.

While the test set of this invention was designed primarily for the testing of oil-filled circuit reclosers, it can also be used for testing vacuum type reclosers, relay type reclosers and sectionalizers. Further, while the invention has been described with reference to a specific embodiment, it will be obvious to those skilled in the art that various changes and modifications can be made to the embodiment shown and described without departing from the spirit and scope of the invention as set forth in the claims.

What is claimed is:

1. A circuit recloser test set comprising:
   a primary circuit for producing a current-regulated voltage at its output said primary circuit including a power resistor bank of sufficient resistivity to minimize the effect of any impedance change in said circuit recloser under test,
   means for coupling said output of said primary circuit to a circuit recloser being tested;
   recloser monitor means coupled to said means for coupling said output of said primary circuit to a circuit recloser being tested; and
   control means coupled to said primary circuit and to said monitor means.

2. A circuit recloser test set as defined in claim 1 wherein said primary circuit comprises:
   a multi-tapped auto-transformer having an input coupled to an AC voltage source and having an output;
   tap select switch means coupled to said multi-tapped auto-transformer;
   a variable auto-transformer having an input coupled to said output of said multi-tapped auto-transformer and having an output;
   a boost transformer having an input coupled to said output of said variable auto-transformer and having an output;
   said power resistor bank having an input coupled to said output of said boost transformer and having an output;
   means coupled to said power resistor bank for selectively changing the value of resistance of said power resistor bank;
   an output transformer having an input and having an output; and
   contactor means coupled between said input of said output transformer and said output of said resistor bank.

3. A circuit recloser test set as defined in claim 2 wherein said means for coupling said output of primary circuit to a circuit recloser being tested is an electrical conductor coupled between said output of said output transformer of said circuit reclosure being tested.

4. A circuit recloser test set as defined in claim 3 wherein said means for coupling said recloser monitor means to said means for coupling said output of said primary circuit to said circuit reclosure being tested is a toroid that is placed around said conductor coupled between said output of said output transformer and said circuit recloser being tested.

5. A circuit recloser test set as defined in claim 4 wherein said recloser monitor means comprises:
   a voltage divider having an input coupled to said air-core toroid and having an output;
   an AC level detector having an input coupled to said output of said voltage divider and having an output;
   a transition detector having an input coupled to said output of said AC level detector and having an output;
   an events counter having an input coupled to said output of said transition detector and having a plurality of outputs;
   an integrator circuit having an input coupled to said output of said voltage divider and having an output;
   a true RMS circuit having an input coupled to said output of said integrator circuit and having an output;
   a first plurality of gates each having first and second inputs and an output;
   means to couple said first input of each one of said first plurality of gates to a different one of said plurality of outputs of said events counter;
   means to couple said output of said true RMS circuit to all of said second inputs of said first plurality of gates;
   a four memory storage element having four separate storage elements;
   means to couple said output of each one of said first plurality of gates to a different one of said four separate storage elements;
   a second plurality of gates each having a first and second input and an output;
   a time base clock source coupled to said first input of all of said second plurality of gates;
   means to couple each one of said second inputs of said second plurality of gates to a different one of said plurality of outputs of said events counter;
   counter means having a plurality of inputs each coupled to a different one of said outputs of said second plurality of gates;
   an analog meter;
   a digital meter;
   means to selectively couple said analog meter and said digital meter to each one of said four storage elements and to said output of said true RMS circuit.

6. A circuit recloser test set as defined in claim 5 wherein said recloser monitor further includes a logic circuit having a first input coupled to one of said plurality of outputs of said events counter and having a second input coupled to said counter means and having a first and a second output; a lock-out relay coupled to said first output of said logic circuit; and an abort relay coupled to said second output of said logic circuit.

7. Apparatus for testing a circuit recloser having a variable reactance exhibited by a solenoid operated plunger therein, comprising:
   a source of test current including a variable transformer means for generating a group of discrete alternating current voltage levels within a selected range, means for adjusting each discrete voltage level within the range for fine adjustment, a series resistance bank having selectable resistances therein, and an output transformer for coupling test current from said source of test current to said circuit recloser, said output transformer having a primary winding which is serially connected to a selected value of said series resistance, and having the output winding thereof connected to the solenoid of said circuit recloser, said selected value series resistance having a resistance magnitude, as reflected through said output transformer, such that the variable impedance of an operating recloser is compensated for by the swamping effect of said series resistance, and means for monitoring the current flow to said circuit recloser from said output transformer.

8. The invention defined in claim 7 including switch means for coupling said test current to said circuit recloser, and means for connecting said monitoring means to said switch means for applying and removing said test current to said circuit recloser.

9. A method of testing current operated electrical power switching equipment which exhibit a variable impedance during operation, comprising generating a selected voltage level which is adjustable over a selected small range, applying said generated voltage through a selectable power resistance bank of sufficient resistivity to swamp out the impedance change of said current operated electrical switching device and sensing and monitoring the current to said current operated electrical power switching equipement.

10. The method defined in claim 9 including an output power transformer between said resistance means and said current operated power switching equipment, an electrically controlled switch between said resistance means and said output transformer, and the further step of monitoring the number of operations performed by said electrical power switching equipment under test and the time duration of each operation, and disconnecting test current after completion of testing or sensing an abnormal operation thereof.

11. In an apparatus for testing a circuit recloser wherein actual fault current conditions are simulated to verify operation of said circuit recloser, and including means for producing and coupling to said circuit recloser simulated fault currents, monitor and control apparatus comprising, inductive sensing means for inductively sensing the simulated fault currents to said circuit recloser and producing an alternating voltage signal proportional thereto, means for converting said alternating voltage signal to a direct current voltage which is proportional to the true RMS value of said inductively sensed simulated fault current, means connected to said inductive sensing means for detecting when said alternating voltage signal rises above a selected voltage level and producing signals indicative of each transition to above and below said selected level, a storage means, and a gate circuit, connected between said storage means and said means for converting, for passing the direct current voltage proportional to the true RMS value of said simulated fault current to said storage means.

12. The invention defined in claim 11 wherein said storage means includes a plurality of storage elements, means for selecting a predetermined number of test shots (openings and closings) for monitoring the application of said simulated fault currents to said circuit recloser, said gate circuit including means for connecting each direct current voltage proportional to the true RMS value of simulated fault current for each test shot to a corresponding storage element in said storage means, respectively.

13. The invention defined in claim 11 including means for automatically monitoring a plurality of simulated fault currents to said circuit recloser and means for storing the true RMS value of simulated fault current delivered to the circuit during each cycle.

14. The invention defined in claim 11 including timing means actuated when said alternating voltage signal is above or below said selected voltage level, and means connected to said timing means for terminating the application of simulated fault current to said circuit recloser when the time exceeds a preselected time limit.

* * * * *